United States Patent [19]
Creta

[11] Patent Number: 6,088,762
[45] Date of Patent: Jul. 11, 2000

[54] POWER FAILURE MODE FOR A MEMORY CONTROLLER

[75] Inventor: Kenneth C. Creta, Gig Harbor, Wash.

[73] Assignee: Intel Corporation, Santa Clara, Calif.

[21] Appl. No.: 09/100,229

[22] Filed: Jun. 19, 1998

[51] Int. Cl.[7] .......................... G06F 12/16; G11C 11/406
[52] U.S. Cl. .......................... 711/106; 365/222; 365/226; 365/228
[58] Field of Search .......................... 711/106; 365/222, 365/226, 227, 228; 713/310, 340

[56] References Cited

U.S. PATENT DOCUMENTS

| | | |
|---|---|---|
| 5,229,970 | 7/1993 | Lee et al. . |
| 5,323,354 | 6/1994 | Matsumoto et al. . |
| 5,630,090 | 5/1997 | Keehn et al. . |
| 5,640,357 | 6/1997 | Kakimi . |
| 5,673,233 | 9/1997 | Wright et al. . |
| 5,923,829 | 7/1999 | Ishii et al. . |

*Primary Examiner*—Jack A. Lane
*Attorney, Agent, or Firm*—Kenyon & Kenyon

[57] ABSTRACT

A power failure mode for a memory controller, such as a memory controller used in an input/output processor, which, when the memory controller has system power, refreshes a memory unit, such as an SDRAM memory unit, as required to maintain the memory image. In one embodiment, when a power failure occurs, the memory controller issues a self-refresh command to the memory, which has battery-backup power. A PCI reset signal may be used to determine when a power failure has occurred. The self-refresh command places the memory in a self-refresh mode, and a programmable logic device may be used to ensure that a clock enable signal input to the memory maintains the self-refresh mode. When system power returns, the memory controller resumes refreshing the memory.

13 Claims, 6 Drawing Sheets

POWER FAILURE MODE FOR A MEMORY CONTROLLER

FIELD

The present invention relates to computer systems. More particularly, the present invention relates to a power failure mode for a computer system memory controller.

BACKGROUND

To improve the performance of a computer system, an Input/Output (I/O) processor may be added to off-load various I/O processing chores. FIG. 1 is a block diagram illustrating an I/O processor 100 and related subsystems. The I/O processor communicates with a host computer system (not shown in FIG. 1) over a primary bus 90. A bus that complies with a Peripheral Component Interconnect (PCI) standard (e.g., PCI Local Bus Specification, Version 2.1, a copy of which may be obtained from the PCI Special Interest Group) is an example of such a primary bus. The I/O processor 100 also communicates with various I/O subsystems 110, 120, 130, such as a network interface card or a hard disk drive, or "disk," subsystem 110, over a secondary PCI bus 95. The I/O processor may also communicate with a local memory 140, generally by using a memory controller.

When the host computer system transfers data with, for example, the disk subsystem 110, the I/O processor 100 may store a copy of the transferred data in the local memory 140. If so, the local memory 140 will contain any data that was recently transferred between the host computer system and the disk subsystem 110. This data in the local memory 140, known as a "cache," may be accessed by the I/O processor 100 faster than the data in the disk subsystem 110.

When the I/O processor 100 receives another request to transfer data between the host computer system and the disk subsystem 110, the I/O processor 100 looks first in the local memory 140 cache. If the data is already there, the I/O processor 100 avoids the time consuming task of accessing the disk subsystem 110. This allows for significantly enhanced I/O and system level performance. Such a cache may be used, for example, in server applications for either networking or storage information. Specifically, an application may use the I/O processor 100 and 128 megabytes (Mb) of local memory 140 to improve the performance of a Small Computer System Interface (SCSI) Redundant Array of Independent Disks (RAID) disk subsystem 110.

One disadvantage of such a cache system is that it assumes that all data sent to the I/O processor 100 is eventually stored on the non-volatile disk subsystem 110. If the data was not moved from the local memory 140 to the disk subsystem 110, the data may be lost if a system power failure occurs which causes the volatile local memory 140 to power down. Thus, the local memory 140 should retain the disk cache data, also referred to as the "memory image"— even in the event of a power failure. To allow this, the local memory 140 may be supplied with battery-backup power.

Certain memory types, such as Dynamic Random Access Memory (DRAM), store information in cells using a capacitor and a transistor. Because a capacitor may lose its electrical charge rather quickly, the DRAM is continuously given a new electric charge, or "refreshed," every few milliseconds (msec).

Consider a local memory 140 that uses DRAM. The refresh function is usually performed by a memory controller in the I/O processor 100. If the entire system loses power, such as during a power outage or when a power supply fails, the memory controller may also lose power. In this case, the memory controller will be unable to refresh the DRAM. Even if the DRAM has battery-backup power, the memory image will be lost if the DRAM is not constantly refreshed. Therefore, some I/O processor designs include an external agent, such an Application Specific Integrated Circuit (ASIC) component with battery-backup power, that refreshes the DRAM in the event of a power failure. Unfortunately, ASIC components are expensive and must be specially designed for a particular system.

Some memory types that need constant refreshing also have a "self-refresh" mode. Synchronous DRAM (SDRAM) is such a memory type. When the memory controller sends the SDRAM a self-refresh command, the SDRAM will continuously refresh itself autonomously with internal logic and timers. A self-refresh feature may be used, for example, to implement a low power mode in a lap-top computer. In such a system, the SDRAM refreshes itself when the memory controller is intentionally powered-down to extend battery life. Because memory contents don't need reloading when the lap-top computer leaves the low power mode, the system can rapidly return to normal operation. The SDRAM self-refresh feature has only been used with respect to intentional low-power modes, not power failures.

In view of the foregoing, a need exists for a method and apparatus that retains information in a local memory system during a power failure, and solves the other problems discussed above.

SUMMARY

In accordance with an embodiment of the present invention, a method of controlling a memory unit having a self-refresh mode is provided. It is first determined if a power failure has occurred. If a power failure has occurred, a self-refresh command is issued to the memory unit, the self-refresh command placing the memory unit in the self-refresh mode.

DETAILED DESCRIPTION

Figure 1:
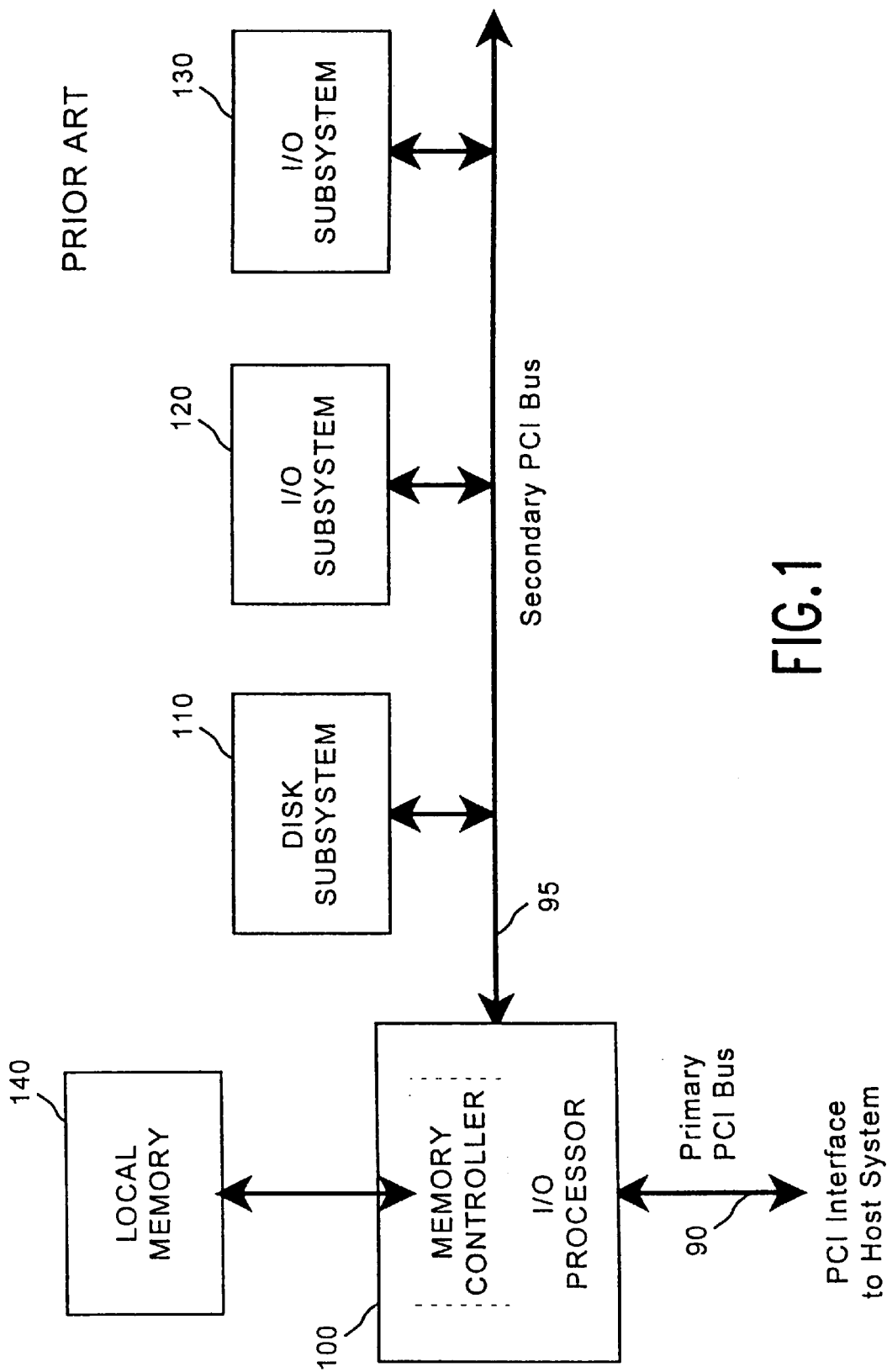
FIG. 1 is a block diagram illustrating a known I/O processor and related subsystems.
Figure 2:
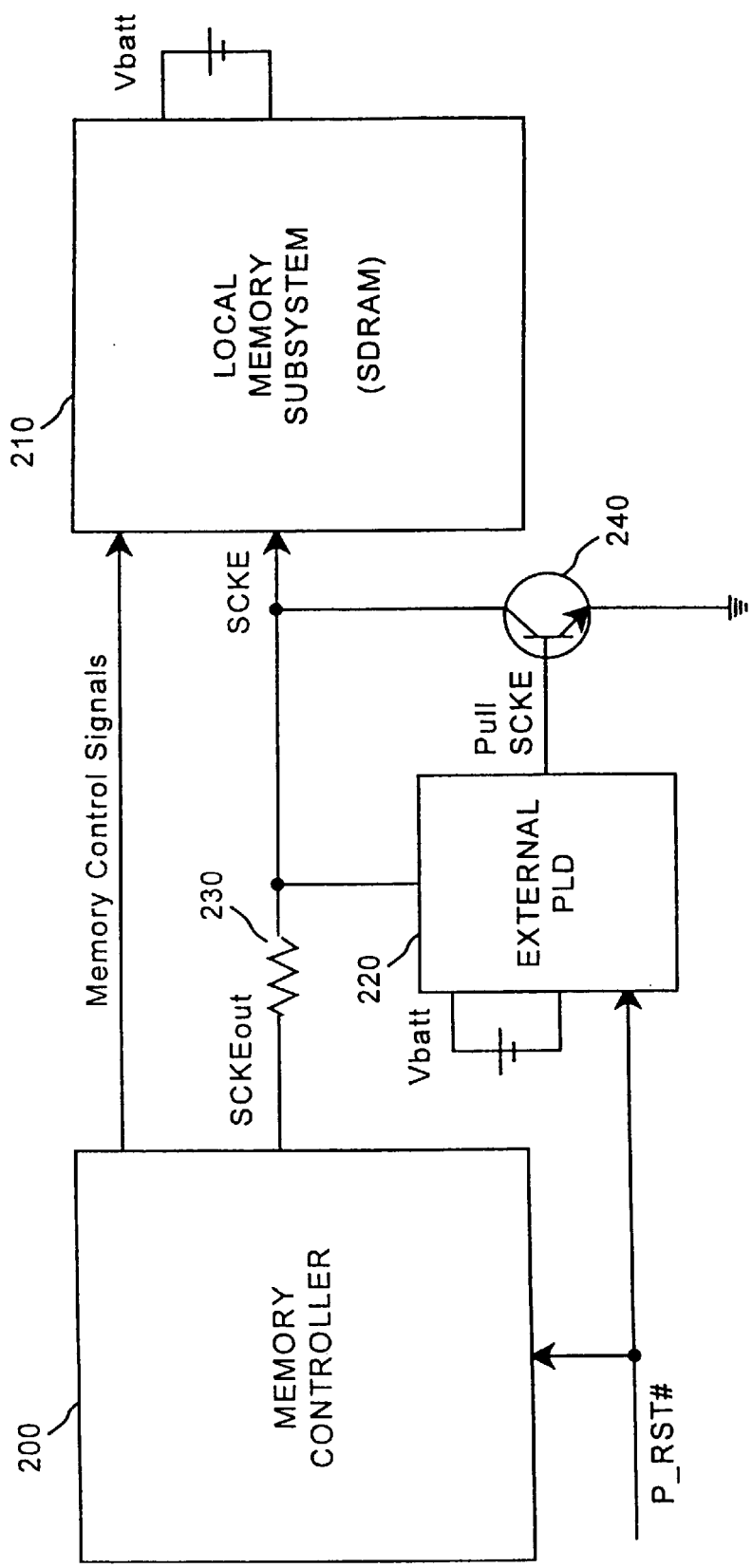
FIG. 2 is a block diagram including circuitry used to implement a memory controller power failure mode according to an embodiment of the present invention.

An embodiment of the present invention is directed to a power failure mode for a memory controller. Referring now in detail to the drawings wherein like parts are designated by like reference numerals throughout, FIG. 2 shows circuitry used to implement such a power failure mode. A memory controller 200 communicates with a local memory subsystem 210, such as an SDRAM array, using memory control signals. The memory controller 200, which could be, for example, part of an I/O processor system, may also communicate with a host computer system (not shown in FIG. 2) over a PCI bus.

The memory controller 200 is normally responsible for refreshing the SDRAM array 210. According to an embodiment of the present invention, the memory controller 200 issues a self-refresh command to the SDRAM array 210 when a system power failure is detected. In this way, assuming the SDRAM array 210 has battery-backup power and is supported by the appropriate external logic, the memory image may be preserved even if the memory controller 200 loses system power. Power to the SDRAM array 210 may be ensured with any adequate battery-backup source ($V_{batt}$) and a reliable method for switching between system power and battery-backup power. When system power returns, the memory controller 200 may resume maintaining the SDRAM array 210 refresh cycles. A detailed description of the circuit shown in FIG. 2 will be provided after the meaning of various signals in the circuit, including the clock enable (SCKE) signal, are discussed.

Figure 3:
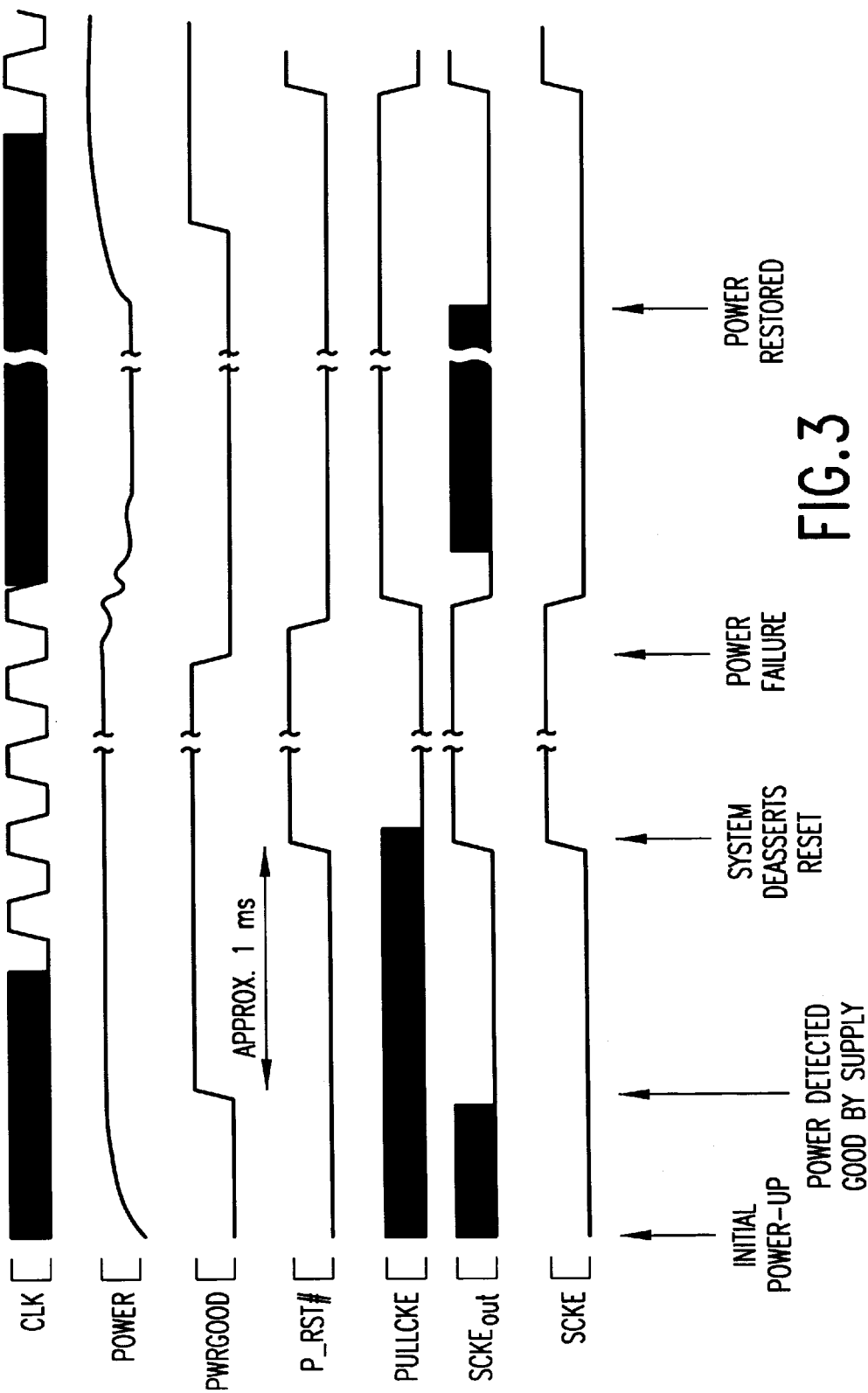
FIG. 3 illustrates a sequence of signals associated with a power failure according to an embodiment of the present invention.

FIG. 3 illustrates a sequence of memory controller 200 signals and events associated with a power failure, and their relation to a system clock signal (CLK), according to an embodiment of the present invention. Upon initial power-up, a power supply begins to provide a system voltage level (POWER) that increases at a rate based on the type of power supply and the particular components used in the system. The power supply often provides a power good (PWRGOOD) signal to indicate when the voltage has reached a reliable level. Similarly, the power supply deasserts the PWRGOOD signal when the voltage level drops below a certain minimum threshold.

The PWRGOOD signal, however, may not be available to the memory controller 200. For example, the memory controller 200 may be part of an I/O processor that only communicates with the host computer system through a PCI interface. In this case, the PWRGOOD signal will not be routed to the memory controller 200. Therefore, an embodiment of the present invention uses a PCI reset (P_RST#) signal, which is associated with a pin in the PCI interface, to determine if a power failure has occurred. The PCI Local Bus Specification Revision 2.1 indicates that once the PWR-GOOD signal is deasserted, the P_RST# signal is asserted in order to float output buffers. In the specification, the time when the P_RST# signal is asserted in response to the power rail going out of specification ($T_{fail}$) is the minimum of: (1) 500 ns from either power rail going out of specification, or exceeding specified tolerances by more than 500 mV; or (2) 100 ns from the 5 V rail falling below the 3.3 V rail by more than 300 mV. In other words, the P_RST# signal is asserted when power begins to fall out of the appropriate threshold. If the P_RST# signal indicates a true power failure, then $V_{batt}$ will be supplied to the SDRAM array 210. If the P_RST# signal indicates any other condition, the SDRAM array 210 will simply be powered down.

Because the memory controller 200 uses the P_RST# signal to determine if a power failure has occurred, the P_RST# signal should remain stable, or "bounce" free, and the gradual application or removal of power should not result in spurious behavior. Moreover, upon power-up the P_RST# signal should be held low until it is officially deasserted by the system. Finally, the P_RST# signal should be asserted when there is still an adequate amount of reliable power remaining. This will give the memory controller 200 sufficient time to execute the required processing in response to the power failure.

When the memory controller 200 determines that a power failure has occurred, a self-refresh command is issued to the SDRAM array 210. This command causes the SDRAM array 210 to autonomously refresh itself and maintain the memory image. The SDRAM array 210 will remain in the self-refresh mode as long as a clock enable (SCKE) signal remains low. That is, the SCKE signal is held low until the memory controller 200 can resume refreshing the SDRAM array 210. Due to high loading on the SCKE signal and other considerations, such as speed of operation, the memory controller 200 may need to drive two copies of the SCKE signal to the SDRAM array 210. For example, according to an embodiment of the present invention, if the SDRAM array 210 is a Dual In-line Memory Module (DIMM) with two memory banks, the board layout will distribute SCKE signals to both memory banks equally.

Although the memory controller 200 is initially responsible for deasserting the SCKE signal when the self-refresh command is issued, the SCKE signal remains deasserted throughout the power-down period, even after the memory controller 200 has lost system power. This may be done, as shown in FIG. 2, using external logic to continually pull the SCKE signal low when the memory controller 200 loses power. Likewise, the external logic may stop pulling the SCKE signal low once the P_RST# signal is deasserted by the system. FIG. 2 illustrates logic for a single SCKE signal. If two signals are desired, this logic may be duplicated.

The embodiment shown in FIG. 2 uses an external Programmable Logic Device (PLD) 220 powered by the battery-backup ($V_{batt}$). The PLD 220 may be, for example, an edge detect state diagram that turns on the pull-down (PullSCKE) signal when the memory controller 200 deasserts $SCKE_{out}$. The PullSCKE signal, the resistor 230 and the transistor 240 ensure that the state of the SCKE signal, which is input to the SDRAM array 210, remains low when power has failed. That is, as long as $V_{batt}$ is active the SCKE signal is pulled down to keep the SDRAM array 210 in self-refresh mode.

When system power returns, the rising edge of the P_RST# signal deactivates the PullSCKE signal. At this point, the memory controller 200 may reliably control the SCKE signal and drives it low. Referring again to FIG. 3, when system power is restored the P_RST# signal is asserted to the memory controller 200. While the I/O processor is reset, the SCKE signal is held low by the memory controller 200. A fixed period of time ($T_{rc}$), such as eight CLK cycles, prior to the normal SDRAM initialization precharge-all command, the memory controller 200 asserts the SCKE signal. Note that an SDRAM initialization sequence does not change memory contents. The memory controller 200 may now resume refreshing the SDRAM array 210.

Figure 4:
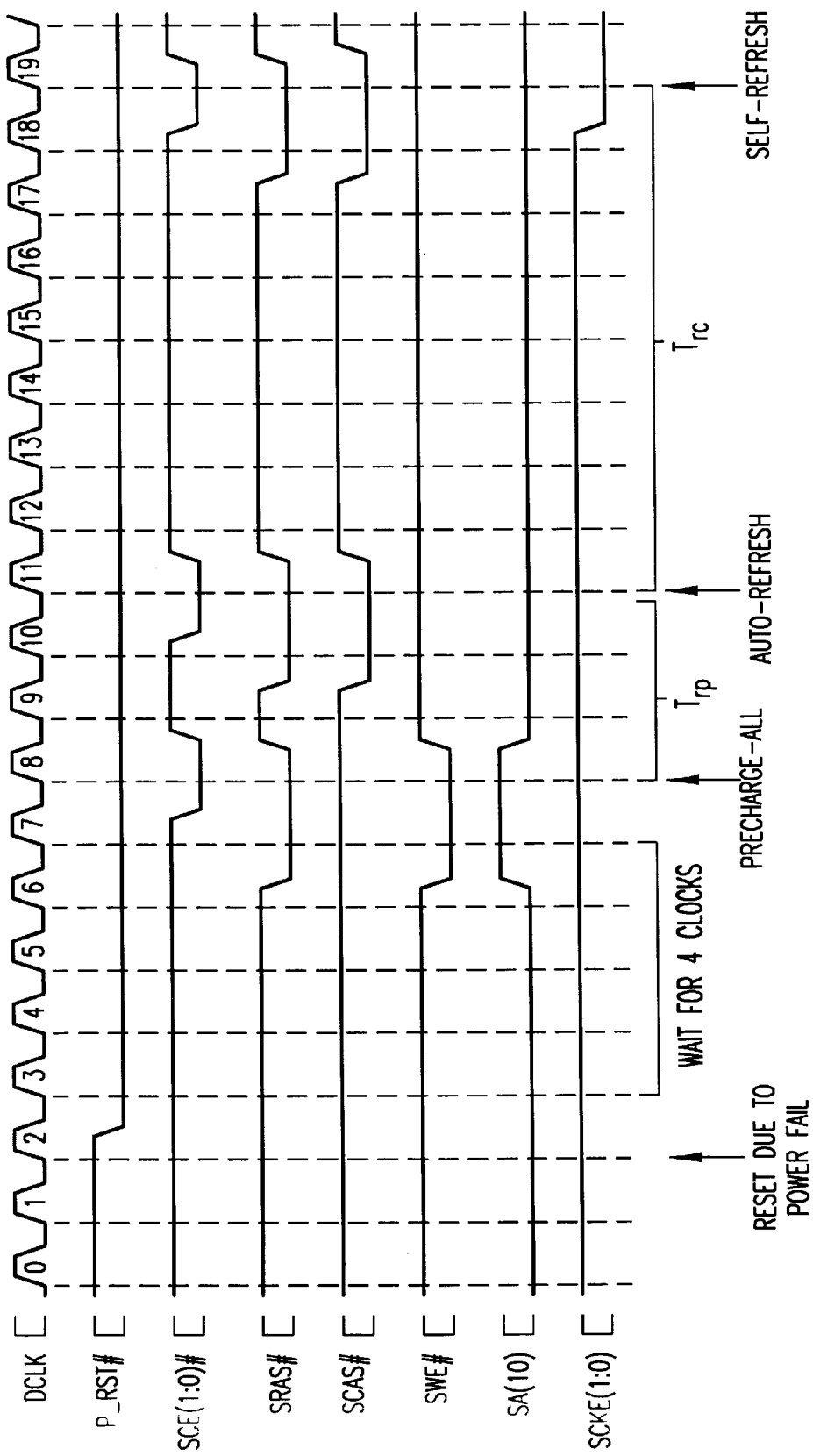
FIG. 4 illustrates waveforms that may be used to implement a memory controller power failure mode according to an embodiment of the present invention.

FIG. 4 illustrates waveforms that may be used to implement the power failure mode, and their relation to a data clock (DCLK) signal, according to an embodiment of the present invention. As explained in detail below, the waveforms illustrate actions, performed by the memory controller 200, that place the SDRAM array 210 in self-refresh mode. When the memory controller 200 detects the assertion of the P_RST# signal, the internal bus may be ignored, since it may be invalid during the P_RST# signal. The memory controller 200 may wait four DCLK cycles to allow any potential SDRAM array 210 bus activity, such as read bursts, to complete before issuing a "precharge-all" command to the SDRAM array 210. The precharge all command precharges both SDRAM banks and sets both banks to an inactive mode. To issue the precharge-all command, as with other commands issued to the SDRAM array 210, the memory controller 200 may set various combinations of the following memory control signals as shown in FIG. 4: an SCE#; a Row Address Strobe (SRAS#); a Column Address Strobe (SCAS#); a Write Enable (SWE#); and an Address (SA).

After deactivating both SDRAM banks with the precharge-all command, the memory controller 200 may wait a fixed period of time ($T_{rp}$), such as three DCLK cycles, and issue an "auto-refresh" command. The auto-refresh command, which can be sent to the SDRAM array 210 when both banks are inactive, causes the device to perform a single refresh cycle automatically. The memory controller 200 may then wait a fixed period of time ($T_{rc}$), such as eight DCLK cycles, and issue the self-refresh command to the SDRAM array 210.

Figure 5:
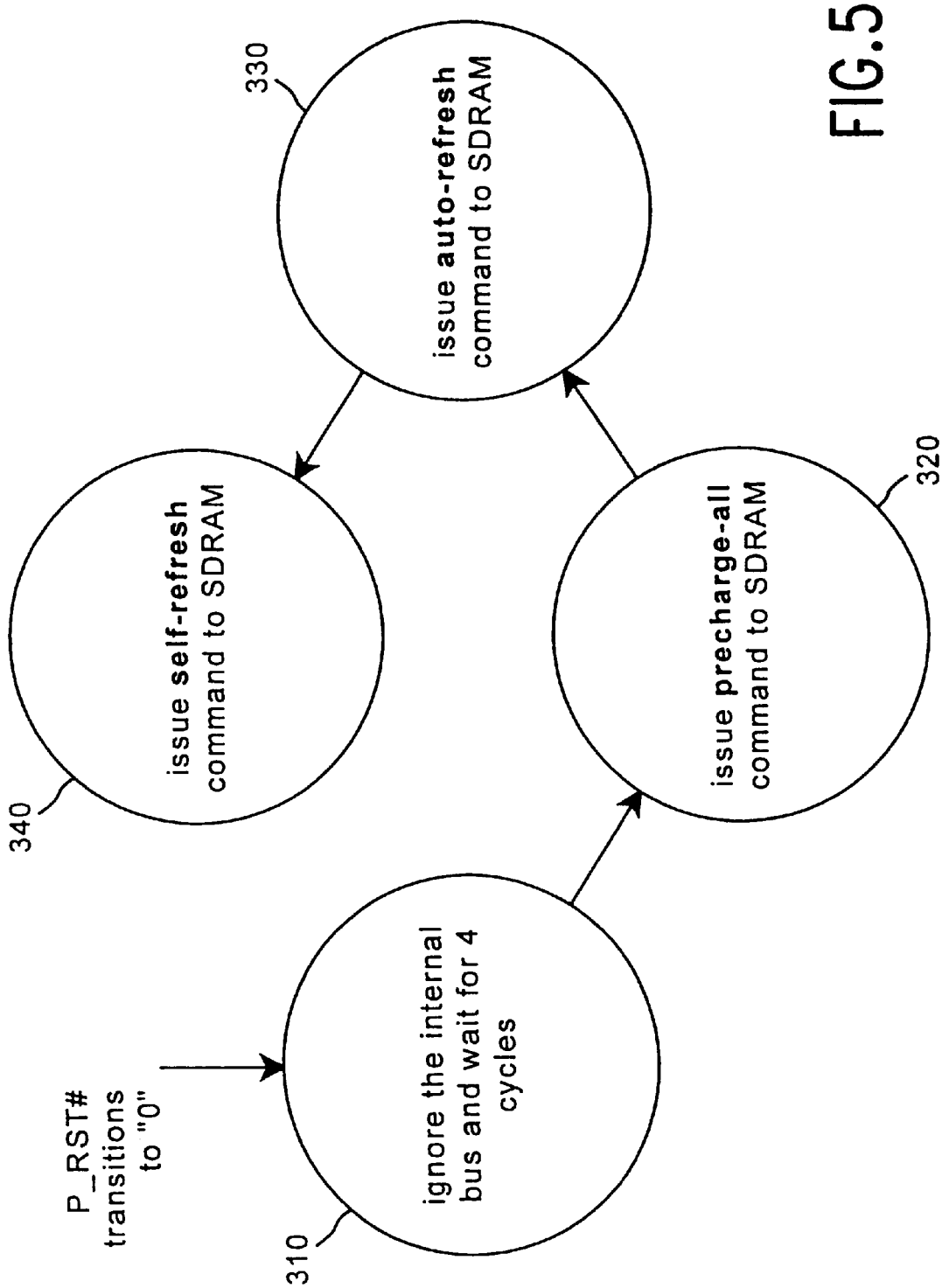
FIG. 5 is a power failure mode state diagram according to an embodiment of the present invention.

FIG. 5 is a power failure mode state diagram according to an embodiment of the present invention. The state diagram represents the behavior of the memory controller 200 during a power failure condition. Since the memory controller 200 uses the assertion of the P_RST# signal to initiate the power-failure state diagram, the memory controller 200 may be reset with a delayed version of the P_RST# signal. The exact delay may depend on the time required by the power-failure state diagram, and will be determined by design. When the P_RST# signal is deasserted, the internal bus may be ignored while the memory controller 200 waits for, by way of example, four clock cycles in state 310. The four clock cycles allow any pipelined SDRAM transactions to complete. Next, a "precharge-all" command is issued to the SDRAM in state 320. After the precharge-all command is issued, an "auto-refresh" command is issued to the SDRAM in state 330. Finally, the self-refresh command is issued to the SDRAM in state 340. Note that, regardless of the initial state, the state diagram may end up in the final "issue self-refresh" state before the P_RST# signal is deasserted.

Figure 6:
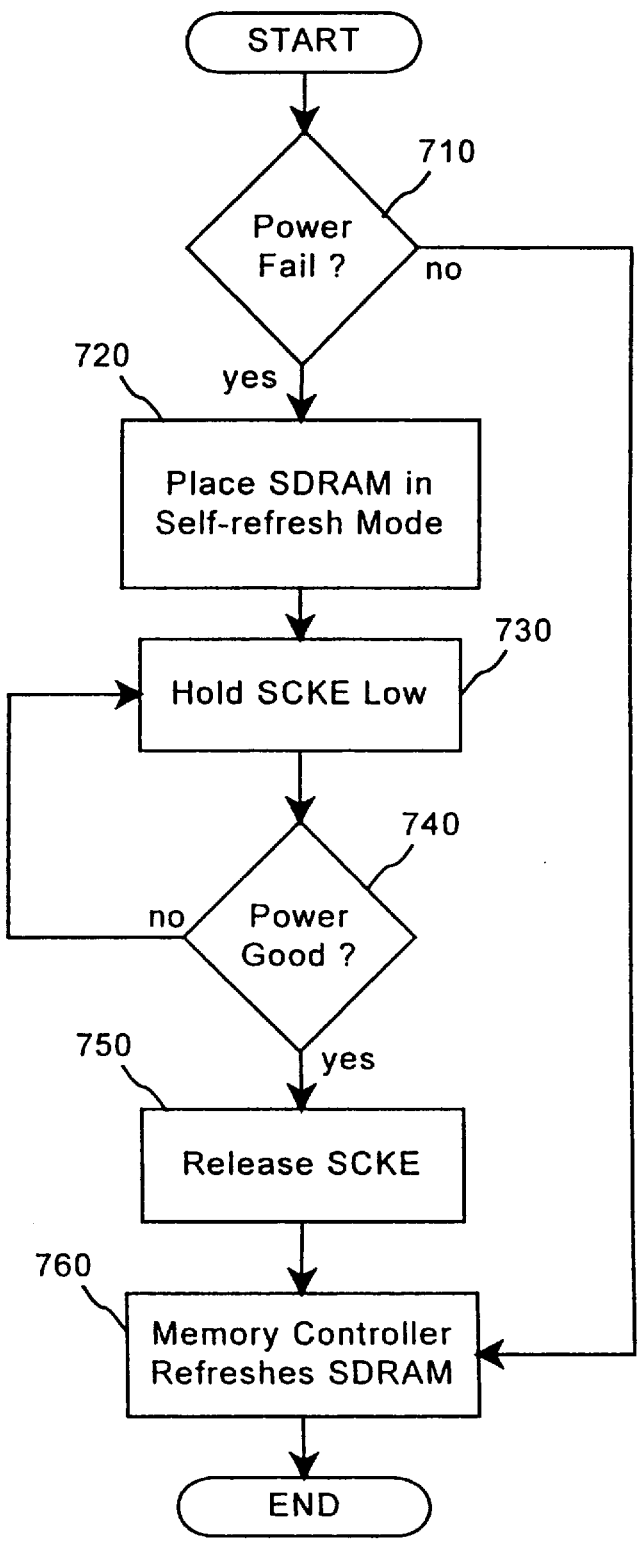
FIG. 6 is a block flow diagram of a method to implement a power failure mode according to an embodiment of the present invention.

FIG. 6 is a block flow diagram of a method to implement a power failure mode according to an embodiment of the present invention. The method shown in FIG. 6 may be used with a memory controller and a memory unit that (1) requires refreshing; (2) has a self-refresh mode; and (3) has an SCKE input that must be held low while the local memory is in self-refresh mode. An SDRAM memory unit is one example of such a memory unit. If a power failure is not detected at block 710, the memory controller refreshes the memory unit, as is normally done, at block 760.

If a power failure is detected at block 710, the memory unit is placed into self-refresh mode and the SCKE input is held low at blocks 720 and 730. At block 740, the SCKE input is held low until the power failure is over. When the power failure is over at block 740, the SCKE signal is released at block 750 and the memory controller again refreshes the local unit at block 760.

Although various embodiments are specifically illustrated and described herein, it will be appreciated that modifications and variations of the present invention are covered by the above teachings and within the purview of the appended claims without departing from the spirit and intended scope of the invention. For example, although the P_RST# signal was used to illustrate a way of determining if a power failure has occurred, it will be appreciated that other ways of determining that a power failure has occurred will also fall within the scope of the invention. Similarly, while an SDRAM array was used as an example of a memory with a self-refresh mode, any memory with a self-refresh mode could be used instead. Moreover, while the invention was described with respect to an I/O processor, it has applications in other computer systems as well. Finally, although software or hardware are described to control certain functions, such functions may be performed using either software, hardware or a combination of software and hardware, as is well known in the art.

What is claimed is:

1. A method of controlling a synchronous dynamic random access memory unit having a self-refresh mode, comprising:
   determining if a power failure has occurred; and
   if the power failure has occurred, then placing the synchronous dynamic random access memory unit in the self-refresh mode, comprising the steps of:
      issuing a precharge-all command to the memory unit;
      issuing an auto-refresh command to the memory unit;
      issuing a self-refresh command to the memory unit; and
      deasserting a clock enable signal to the memory unit.

2. The method of claim 1, wherein said determining is based on a peripheral component interconnect reset signal.

3. The method of claim 1, further comprising:
   determining if the power failure is over; and
   asserting the clock enable signal input to the memory unit if the power failure is over.

4. The method of claim 1, wherein said determining and said issuing are performed by a memory controller.

5. The method of claim 1, wherein deasserting the clock enable signal is performed by a programmable logic device.

6. A memory system, comprising:
   a synchronous dynamic random access memory unit having a self-refresh mode and battery-backup power; and
   a memory controller coupled to said memory unit, said memory controller being configured to place said memory unit in the self-refresh mode when a power failure has occurred, comprising the steps of:
      issuing a precharge-all command to said memory unit;
      issuing an auto-refresh command to said memory unit;
      issuing a self-refresh command to said memory unit; and
      deasserting a clock enable signal input to said memory unit.

7. The memory system of claim 6, wherein said memory controller determines if a power failure has occurred based on a peripheral component interconnect reset signal.

8. The memory system of claim 6, further comprising:
   a programmable logic device, with battery-backup power, coupled to said memory controller and said memory unit, said programmable logic device being configured to deassert the clock enable signal when a power failure has occurred.

9. A memory controller, controlling a synchronous dynamic random access memory unit having a self-refresh mode, comprising:
   a power status input port;
   a memory control output port;
   a clock enable output port; and
   control logic, coupled to said power status input port, to said memory control output port, and to said clock enable output port, said control logic configured to place said memory unit in the self-refresh mode based on a signal received from said power status input port, comprising the steps of:
      issuing a precharge-all command through said memory control output port;
      issuing an auto-refresh command through said memory control output port;

issuing a self-refresh command through said memory control output port; and deasserting a signal through said clock enable output port.

10. The memory controller of claim 9, wherein said power status input port is a peripheral component interconnect reset input port.

11. A memory controller, controlling a synchronous dynamic random access memory unit having a self-refresh mode, comprising:

means for determining if a power failure has occurred; and means for placing the synchronous dynamic random access memory unit in a self-refresh mode if the power failure has occurred, comprising:

means for issuing a precharge-all command to the memory unit;

means for issuing an auto-refresh command to the memory unit;

means for issuing a self-refresh command to the memory unit; and means for deasserting a clock enable signal input to the memory unit.

12. A computer readable medium having stored thereon instructions which, when executed by a memory controller, cause the memory controller to control a synchronous dynamic random access memory unit having a self-refresh mode, comprising:

determining if a power failure has occurred; and if the power failure has occurred, then placing the synchronous dynamic random access memory unit in the self-refresh mode, comprising the steps of:

issuing a precharge-all command to the memory unit;

issuing an auto-refresh command to the memory unit;

issuing a self-refresh command to the memory unit; and deasserting a clock enable signal to the memory unit.

13. A computer storage system, comprising:

a disk subsystem;

a synchronous dynamic random access memory unit having a self-refresh mode; and a memory controller coupled to said memory unit and said disk subsystem, said memory controller being configured to place said memory unit in the self-refresh mode comprising the steps of:

issuing a precharge-all command to said memory unit;

issuing an auto-refresh command to said memory unit;

issuing a self-refresh command to said memory unit; and deasserting a clock enable signal input to said memory unit.

* * * * *